(12) United States Patent
Hsu

(10) Patent No.: US 7,746,148 B2
(45) Date of Patent: Jun. 29, 2010

(54) HIGH-SIDE DRIVER

(75) Inventor: Hsien-Wen Hsu, Hsinchu County (TW)

(73) Assignee: inergy Technology Inc., Hsinchu County (TW)

( * ) Notice: Subject to any disclaimer, the term of this patent is extended or adjusted under 35 U.S.C. 154(b) by 0 days.

(21) Appl. No.: 12/324,843

(22) Filed: Nov. 27, 2008

(65) Prior Publication Data

US 2009/0256619 A1 Oct. 15, 2009

(30) Foreign Application Priority Data

Apr. 14, 2008 (TW) .............. 97113508 A

(51) Int. Cl.
*H03L 5/00* (2006.01)

(52) U.S. Cl. .............. 327/333; 326/63; 326/81

(58) Field of Classification Search ............. 326/61–63, 326/80–81; 327/306, 333
See application file for complete search history.

(56) References Cited

U.S. PATENT DOCUMENTS

| 4,532,436 | A | * | 7/1985 | Bismarck | 327/208 |
| 5,781,026 | A | * | 7/1998 | Chow | 326/26 |
| 6,028,469 | A | * | 2/2000 | Roither et al. | 327/362 |
| 6,445,210 | B2 | * | 9/2002 | Nojiri | 326/68 |
| 6,535,018 | B1 | * | 3/2003 | Kost | 326/68 |
| 6,639,427 | B2 | * | 10/2003 | Dray et al. | 326/17 |

* cited by examiner

*Primary Examiner*—Dinh T. Le
(74) *Attorney, Agent, or Firm*—CKC & Partners Co., Ltd.

(57) ABSTRACT

A high-side driving circuit is provided, where Q terminal and $\overline{Q}$ terminal of the latch circuit respectively feed back to the first switch and the second switch, which may control asymmetric impedance, such that the high-side driving circuit can prevent noise.

8 Claims, 5 Drawing Sheets

US 7,746,148 B2

HIGH-SIDE DRIVER

RELATED APPLICATIONS

This application claims priority to Taiwan Application Serial Number 97113508, filed Apr. 14, 2008, which is herein incorporated by reference.

BACKGROUND

1. Field of Invention

The present invention relates to a circuit. More particularly, the present invention relates to a high-side driver.

2. Description of Related Art

Please refer to FIG. 1. FIG. 1 is a circuit diagram of a conventional high-side driver. In FIG. 1, the signal generator 110 may control the latch is circuit 150 to drive the high-side driver 160.

For a more complete understanding of the conventional high-side driver, please refer to FIG. 1 and FIG. 2A. FIG. 2A is a timing diagram showing the wave shape of the respective signals of the conventional high-side driver of FIG. 1. If the first pulse output terminal $C_S$ of the signal generator 110 outputs a first pulse signal to turn on the first transistor 130. Then, the electric potential at the node $D_{R1}$ is dropped so the first output terminal Q outputs a high level electric potential to turn on the high-side transistor 260. On the other hand, if the second pulse output terminal $C_R$ of the signal generator 110 outputs a second pulse signal to turn on the first transistor 130, then the electric potential at the node $D_{R2}$ is dropped so that the first output terminal Q outputs a low level electric potential to cut off the high-side transistor 260.

However, please refer to FIG. 2B. FIG. 2B is another timing diagram showing the wave shape of the respective signals of the conventional high-side driver of FIG. 1. If the electric potential applied by the power supply $V_{DD}$ is floating, noise may be generated at the nodes $D_{R1}$, $D_{R2}$, so that the high/low level electric potential outputted by the latch circuit 150 is wrong.

For the foregoing reasons, there is a need for a noise immune high-side driver.

SUMMARY

It is therefore an objective of the present invention to provide a noise immune high-side driver.

In accordance with an embodiment of the present invention, A high-side driver comprises a first impedance element, a first switch, a second impedance element, a first transistor, a third impedance element, a second switch, a fourth impedance element, a second transistor, a signal generator and a latch circuit. The first impedance element has a terminal electrically coupled with a power supply. The first switch is electrically coupled in parallel with the first impedance element. The second impedance element has a terminal electrically coupled with another terminal of the first impedance element. The first transistor has a drain electrically coupled with another terminal of the second impedance element. The third impedance element has a terminal electrically coupled with the power supply. The second switch electrically coupled in parallel with the third impedance element. The fourth impedance element has a terminal electrically coupled with another terminal of the third impedance element. The second transistor has a drain electrically coupled with another terminal of the fourth impedance element. The signal generator has a first pulse output terminal and a second pulse output terminal, wherein the first pulse output terminal is electrically coupled with a gate of the first transistor, the second pulse output terminal is electrically coupled with a gate of the second transistor. The latch circuit has a set terminal, a reset terminal and a first output terminal and a second output terminal, wherein the set terminal is electrically coupled with the drain of the first transistor, the reset terminal is electrically coupled with the drain of the second transistor and another terminal of the fourth impedance element, the first output terminal is electrically coupled with the first switch, the second output terminal is electrically coupled with the second switch.

It is to be understood that both the foregoing general description and the following detailed description are by examples, and are intended to provide further explanation of the invention as claimed.

BRIEF DESCRIPTION OF THE DRAWINGS

For a more complete understanding of the present invention, and the advantages thereof, reference is now made to the following descriptions taken in conjunction with the accompanying drawing, in which.

DESCRIPTION OF THE PREFERRED EMBODIMENTS

Figure 1:
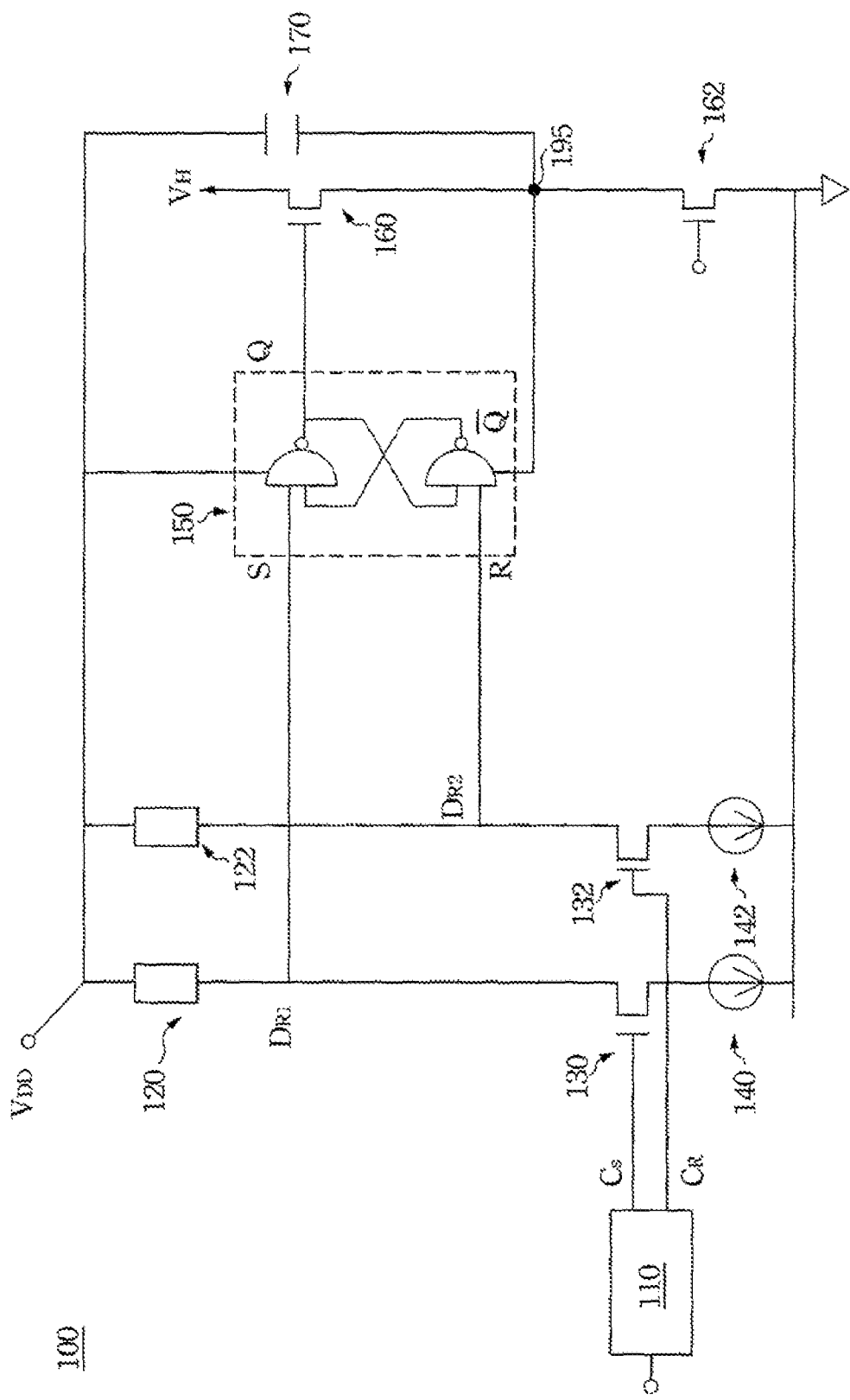
FIG. 1 is a circuit diagram of a conventional high-side driver.
Figure 2A:
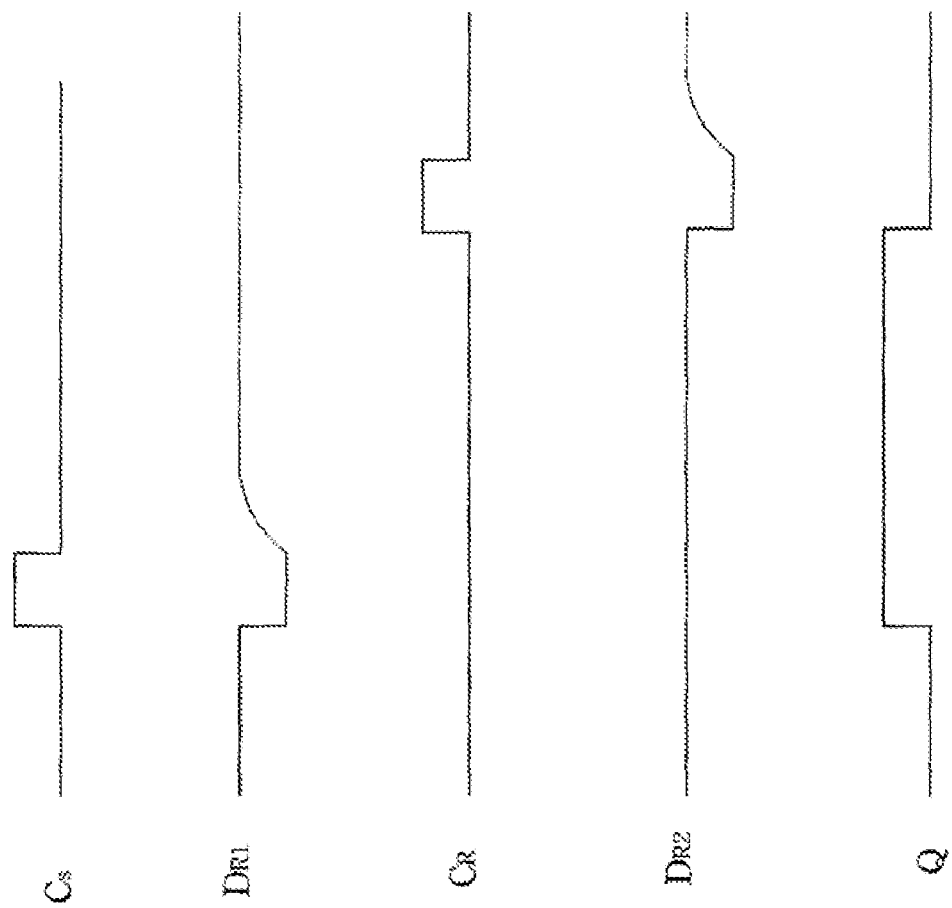
FIG. 2A is a timing diagram showing the wave shape of the respective signals of the conventional high-side driver of FIG. 1.
Figure 2B:
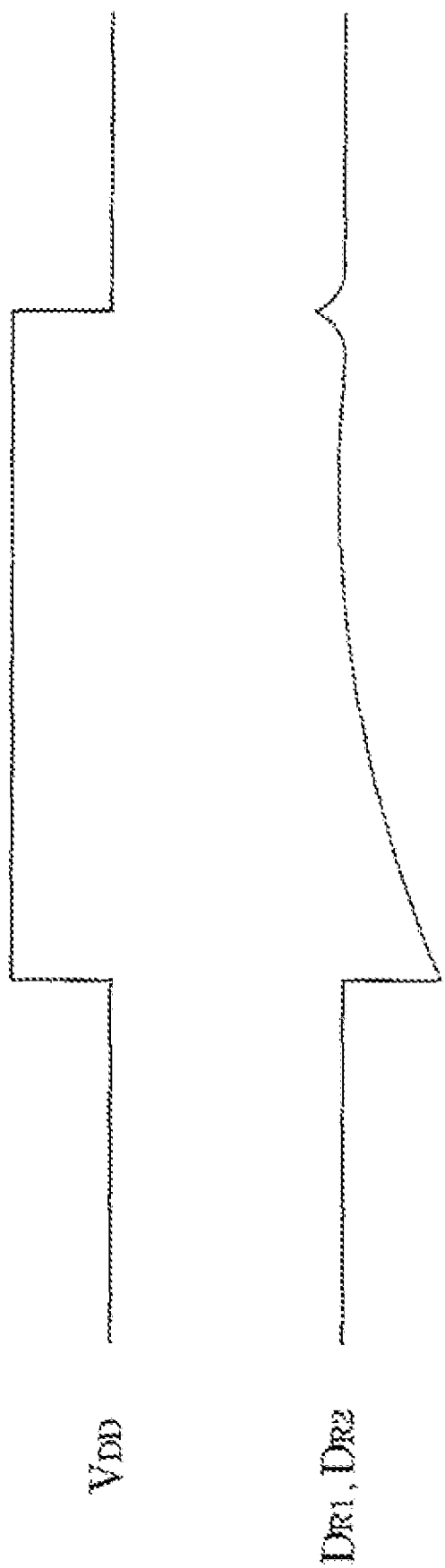
FIG. 2B is another timing diagram showing the wave shape of the respective signals of the conventional high-side driver of FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
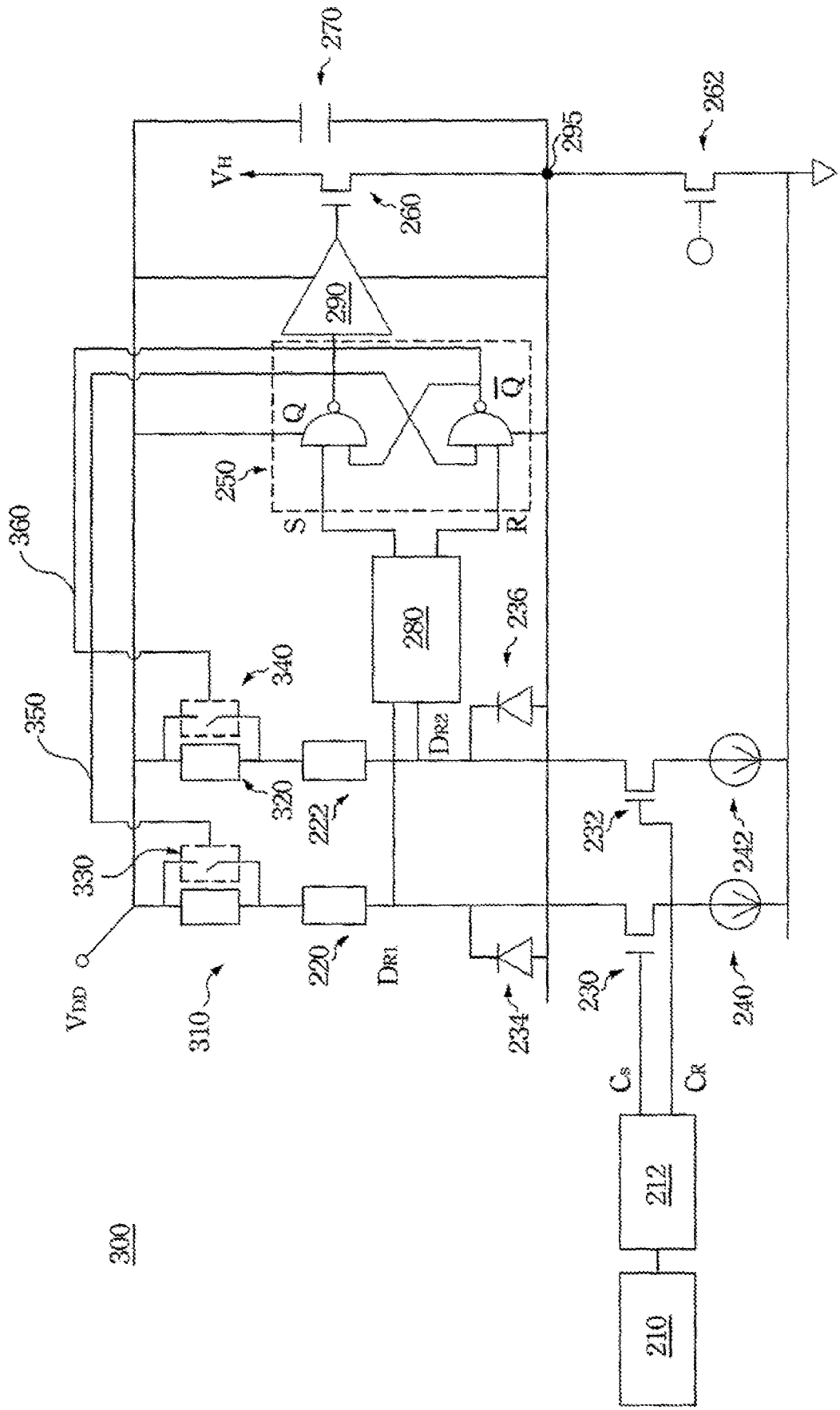
FIG. 3 is a circuit diagram of a high-side driver according to one or more aspects of the present disclosure.

Please refer to FIG. 3. FIG. 3 is a circuit diagram of a high-side driver according to one or more aspects of the present disclosure. In FIG. 3, the high-side driver 300 comprises a first impedance element 310, a first switch 330, a second impedance element 220, a first transistor 230, a third impedance element 320, a second switch 340, a fourth impedance element 222, a second transistor 232, a signal generator 212 and a latch circuit 250. The first impedance element 310 has a terminal electrically coupled with the power supply $V_{DD}$ and the bootstrap capacitor 270. The first switch 330 is electrically coupled in parallel with the first impedance element 310. The second impedance element 220 has a terminal electrically coupled with another terminal of the first impedance element 310. The drain of the first transistor 230 is electrically coupled with another terminal of the second impedance element 220 via the node $D_{R1}$. The source of the first transistor 230 is electrically coupled with another terminal of a terminal of the first current source 240, and another terminal of the first current source 240 is electrically coupled with the source of the low side driver 262. The third impedance element 320 has a terminal electrically coupled with the power supply $V_{DD}$ and the bootstrap capacitor 270. The bootstrap capacitor 270 is electrically coupled with the low side transistor 262 via the junction 295. The second switch 340 is electrically coupled in parallel with the third impedance element 320. The fourth impedance element 222 has a terminal electrically coupled with another terminal of the third impedance element 320. The drain of the second transistor 232 is electrically coupled with another terminal of the fourth impedance element 222 via the node $D_{R2}$. The source of the second transistor 232 is electrically coupled with another terminal of a terminal of the second current source 242, and another terminal of the second current source 242 is electrically coupled with the source of the low side driver 262. The signal generator 212 has a first pulse output terminal $C_S$ and a second pulse output terminal $C_R$, in which the first pulse output terminal $C_S$ is electrically coupled with the gate of the first transistor 230, the second pulse output terminal $C_R$ is electrically coupled with the gate of the second transistor 232. The latch circuit 250 has a set terminal S, a reset terminal R and a first output terminal Q and a second output terminal $\overline{Q}$. The set terminal S is electrically coupled with the drain of the first transistor 230 via the filter 280. The reset terminal R is electrically coupled with the drain of the second transistor 232 via the filter 280. The first output terminal Q is electrically coupled with the first switch 330, and it is also electrically coupled with the gate of the high transistor 260 (via the driver 290). The second output terminal $\overline{Q}$ is electrically coupled with the second switch 340. Note that the resistance value of first impedance element 310 approximately equals the resistance value of the third impedance element 350, and the resistance value of second impedance element 220 approximately equals the resistance value of the fourth impedance element 222. The first switch 330 may also be a transistor, such as MOS or the like; the second switch 340 may be a transistor, such as MOS or the like.

Moreover, the high-side driver 300 may further comprise the filter 280 and the driver 290. The filter 280 is capable of filtering some noise for the latch circuit 250. The driver 290 which may act as an amplifier is capable of driving the high-side transistor 260. Additionally, the high-side driver 300 may also comprise a first diode 234 and a second diode 236. The anode of the first diode 234 and the anode of the second diode 236 both are electrically coupled with the bootstrap capacitor 270 via the junction 295. The cathode of the first diode 234 is electrically coupled with the second impedance element 220 via the node $D_{R1}$, and the cathode of the second diode 236 is electrically coupled with the fourth impedance element 222 via the node $D_{R2}$. The first diode 234 is capable of preventing the drain potential of the first transistor 230 from becoming excessively negative; the second diode 236 is capable of preventing the drain potential of the second transistor 232 from becoming excessively negative.

Please continue referring to FIG. 3. The high-side driver 300 may further comprise a controller 210. In FIG. 3, the controller 210 is electrically coupled with the signal generator 212. The controller 210 may control the signal generator 212 to output a pulse signal. In an embodiment, the first pulse output terminal $C_S$ of the signal generator 212 may output a first pulse signal, which is controlled by the controller 210. Then, the first transistor 230 is turned on. Comparatively, the first output terminal Q of the latch circuit 250 outputs a high level electric potential that may be maintained at logic 1 level, and the second output terminal $\overline{Q}$ of the latch circuit 250 outputs a low level electric potential that may be maintained at logic 0 level, where the high level electric potential may turn on the high-side transistor 260. Additionally, note that the high level electric potential may cut off the first switch 330, and the low level electric potential may turn on the second switch 340. In this way, if the electric potential applied by the power supply $V_{DD}$ is floating, the noise may be generated at the nodes $D_{R1}$, $D_{R2}$. However, the electric potential of the noise at the node $D_{R1}$ is less than the electric potential of the noise at the node $D_{R2}$, so that the latch circuit 250 is free of noise, that is to say, the first output terminal Q of the latch circuit 250 continuously outputs the high level electric potential that must be maintained at logic 1 level. On the other hand, the second pulse output terminal $C_R$ of the signal generator 212 may output a second pulse signal, which is controlled by the controller 210. Then, the second transistor 232 is turned on. Comparatively, the first output terminal Q of the latch circuit 250 outputs a low level electric potential that may be maintained at logic 0 level, and the second output terminal $\overline{Q}$ of the latch circuit 250 outputs a high level electric potential that may be maintained at logic 1 level, where the low level electric potential may cut off the high-side transistor 260. Additionally, it should be noted that the low level electric potential may turn on the first switch 330, and the high level electric potential may cut off the second switch 340. In this way, if the electric potential applied by the power supply $V_{DD}$ is floating, the noise may be generated at the nodes $D_{R1}$, $D_{R2}$. However, the electric potential of the noise at the node $D_{R1}$ is greater than the electric potential of the noise at the node $D_{R2}$, so that the latch circuit 250 is free of noise, that is to say, the first output terminal Q of the latch circuit 250 continuously outputs the low level electric potential that must be maintained at logic 0 level.

Figure 4A:
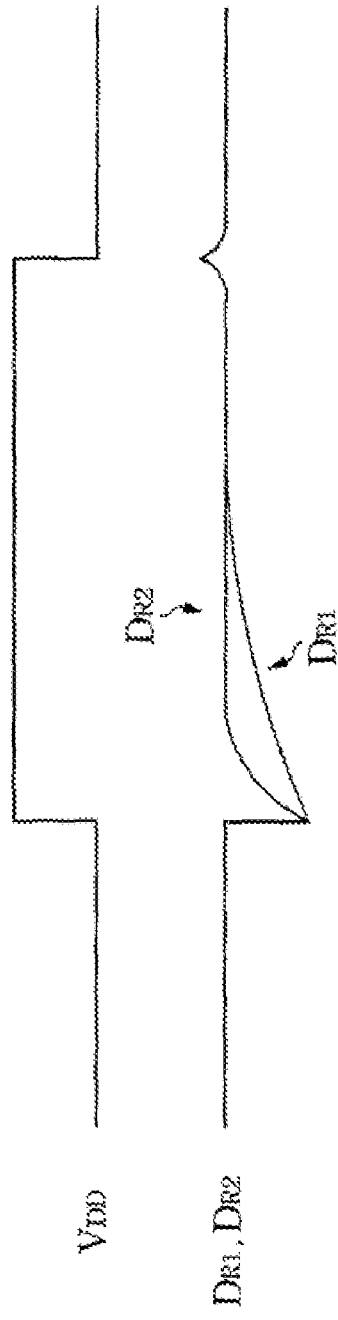
FIG. 4A is a timing diagram showing the wave shape of the respective signals of the high-side driver of FIG. 3.
Figure 4B:
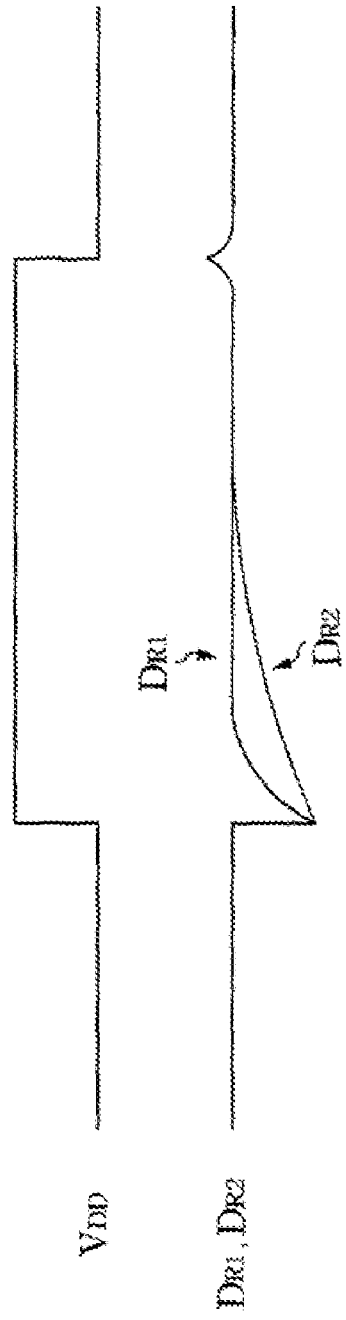
FIG. 4B is another timing diagram showing the wave shape of the respective signals of the high-side driver of FIG. 3.

For a more complete understanding of the present invention, and the advantages thereof, please refer to FIG. 4A and FIG. 4B. FIG. 4A is a timing diagram showing the wave shape of the respective signals of the high-side driver of FIG. 3; and FIG. 4B is another timing diagram showing the wave shape of the respective signals of the high-side driver of FIG. 3. If the first pulse output terminal $C_S$ of the signal generator 212 may output a first pulse signal, and then the first output terminal Q of the latch circuit 250 outputs a high level electric potential that may be maintained at logic 1 level. In FIG. 4A, if the electric potential applied by the power supply $V_{DD}$ is floating, the noise may be generated at the nodes $D_{R1}$, $D_{R2}$. However, the first output terminal Q and the second output terminal $\overline{Q}$ feedback to the first switch 330 and the second switch 340, respectively. Therefore, the first switch 330 is cut off and the second switch 340 is turned on. In this way, the third impedance element 320 is short-circuited. Consequently, the electric potential of the noise at the node $D_{R1}$ is less than the electric potential of the noise at the node $D_{R2}$, so that the latch circuit 250 is free of noise, that is to say, the first output terminal Q of the latch circuit 250 continuously outputs the high level electric potential that may be maintained at logic 1 level. On the other hand, if the second pulse output terminal $C_R$ of the signal generator 212 may output a second pulse signal, and then the first output terminal Q of the latch circuit 250 outputs a low level electric potential that may be maintained at logic 0 level. In FIG. 4B, if the electric potential applied by the power supply $V_{DD}$ is floating, the noise may be generated at the nodes $D_{R1}$, $D_{R2}$. However, the first output terminal Q and the second output terminal $\overline{Q}$ feedback to the first switch 330 and the second switch 340, respectively. Therefore, the first switch 330 is turned on and the second switch 340 is cut off. In this way, the first impedance element 310 is short-circuited. Consequently, the electric potential of the noise at the node $D_{R1}$ is greater than the electric potential of the noise at the node $D_{R2}$, so that the latch circuit 250 is free of noise, that is to say, the first output terminal Q of the latch circuit 250 continuously outputs the low level electric potential that may be maintained at logic 0 level. Thus, either the first pulse signal outputted by the first pulse output terminal $C_S$ or the second pulse signal outputted by the second pulse output terminal $C_R$ can change the output status of the latch circuit 250, and the noise can't have any effect upon the output status of the latch circuit 250.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high-side driver, comprising:
    a first impedance element having a terminal electrically coupled with a power supply;
    a first switch electrically coupled in parallel with the first impedance element;
    a second impedance element has a terminal electrically coupled with another terminal of the first impedance element;
    a first transistor having a drain electrically coupled with another terminal of the second impedance element;
    a third impedance element having a terminal electrically coupled with the power supply;
    a second switch electrically coupled in parallel with the third impedance element;
    a fourth impedance element having a terminal electrically coupled with another terminal of the third impedance element;
    a second transistor having a drain electrically coupled with another terminal of the fourth impedance element;
    a signal generator has a first pulse output terminal and a second pulse output terminal, wherein the first pulse output terminal is electrically coupled with a gate of the first transistor, the second pulse output terminal is electrically coupled with a gate of the second transistor;
    a latch circuit having a set terminal, a reset terminal and a first output terminal and a second output terminal, wherein the set terminal is electrically coupled with the drain of the first transistor, the reset terminal is electrically coupled with the drain of the second transistor and another terminal of the fourth impedance element, the first output terminal is electrically coupled with the first switch, the second output terminal is electrically coupled with the second switch; and
    a controller for controlling the signal generator to selectively output a first pulse signal or a second pulse signal.

2. The high-side driver as claimed in claim 1, wherein resistance value of the first impedance element approximately equals resistance value of the third impedance element, and resistance value of the second impedance element approximately equals resistance value of the fourth impedance element.

3. The high-side driver as claimed in claim 1, wherein the first pulse output terminal outputs the first pulse signal to turn on the first transistor, than the first output terminal of the latch circuit outputs a high level electric potential, and the second output terminal of the latch circuit outputs a low level electric potential.

4. The high-side driver as claimed in claim 3, wherein the high level electric potential enables the first switch to cut off, and the low level electric potential enables the second switch to turn on.

5. The high-side driver as claimed in claim 4, wherein the first output terminal continuously outputs the high level electric potential.

6. The high-side driver as claimed in claim 1, wherein the second pulse output terminal outputs the second pulse signal to turn on the second transistor, than the second output terminal of the latch circuit outputs a high level electric potential, and the first output terminal of the latch circuit outputs a low level electric potential.

7. The high-side driver as claimed in claim 6, wherein the low level electric potential enables the first switch to turn on, and the high level electric potential enables the second switch to cut off.

8. The high-side driver as claimed in claim 7, wherein the first output terminal continuously outputs the low level electric potential.

* * * * *